(12) United States Patent
Mönig et al.

(10) Patent No.: US 9,313,908 B2
(45) Date of Patent: Apr. 12, 2016

(54) MOBILE IDENTIFICATION INDICATOR

(75) Inventors: Stefan Mönig, Schwelm (DE); Alexander Geldmacher, Wuppertal (DE)

(73) Assignee: HUF HULSBECK & FURST GMBH & CO. KG, Velbert (DE)

( * ) Notice: Subject to any disclaimer, the term of this patent is extended or adjusted under 35 U.S.C. 154(b) by 630 days.

(21) Appl. No.: 13/574,633

(22) PCT Filed: Jan. 26, 2011

(86) PCT No.: PCT/EP2011/051084
§ 371 (c)(1),
(2), (4) Date: Sep. 14, 2012

(87) PCT Pub. No.: WO2011/092215
PCT Pub. Date: Aug. 4, 2011

(65) Prior Publication Data
US 2013/0010414 A1 Jan. 10, 2013

(30) Foreign Application Priority Data

Jan. 26, 2010 (DE) .......................... 10 2010 001 233

(51) Int. Cl.
| | |
|---|---|
| *G06F 1/16* | (2006.01) |
| *H05K 5/02* | (2006.01) |
| *B41J 3/28* | (2006.01) |
| *B41J 3/407* | (2006.01) |
| *E05B 17/10* | (2006.01) |
| *E05B 19/24* | (2006.01) |
| *G07C 9/00* | (2006.01) |

(52) U.S. Cl.
CPC ................. *H05K 5/0243* (2013.01); *B41J 3/28* (2013.01); *B41J 3/407* (2013.01); *E05B 17/103* (2013.01); *E05B 19/24* (2013.01); *G07C 9/00944* (2013.01)

(58) Field of Classification Search
CPC ..................... E05B 19/0082; H01H 2231/026
USPC ................... 347/111; 340/5.62, 5.72, 426.36, 340/426.35; 362/23.04, 23.05; 361/679.01
See application file for complete search history.

(56) References Cited

U.S. PATENT DOCUMENTS 4,786,767 A * 11/1988 Kuhlman ....................... 200/5 A
5,784,171 A    7/1998 Kano
(Continued)

FOREIGN PATENT DOCUMENTS

CN    1344213 A    4/2002
CN    101444035 A    5/2009
(Continued)

OTHER PUBLICATIONS

Chinese Office Action for corresponding application CN201180013428.4; Report Dated Jun. 26, 2014.
(Continued)

*Primary Examiner* — Anthony Haughton
(74) *Attorney, Agent, or Firm* — Cantor Colburn LLP

(57) ABSTRACT

The invention relates to a mobile identification indicator (1) for locking and unlocking a closure device of a motor vehicle, comprising an electronic unit (6) disposed inside a housing (2). According to the invention, the housing (2) has a defined outer surface (7) on which is applied a functional coating (10), wherein the functional coating (10) comprises an information layer (11) for individualizing the identification indicator (1).

12 Claims, 3 Drawing Sheets

(56) References Cited

U.S. PATENT DOCUMENTS

| | | |
|---|---|---|
| 6,980,095 B2 | 12/2005 | Wright |
| 7,897,888 B2 * | 3/2011 | Dimig .................. 200/302.2 |
| 8,330,574 B2 * | 12/2012 | DiSalvo ................. 340/5.72 |
| 8,541,705 B2 * | 9/2013 | Dimig .................. 200/302.2 |
| 8,662,688 B2 * | 3/2014 | Nickel et al. ........... 362/23.05 |
| 2007/0160831 A1 | 7/2007 | Hsieh et al. |
| 2007/0227866 A1 | 10/2007 | Dimig |
| 2011/0162949 A1 * | 7/2011 | Dimig ..................... 200/505 |

FOREIGN PATENT DOCUMENTS

| | | |
|---|---|---|
| DE | 4429999 C1 | 3/1996 |
| DE | 4441988 A1 | 5/1996 |
| DE | 20120565 U1 | 7/2002 |
| DE | 10106956 A1 | 8/2002 |
| DE | 69911132 T2 | 7/2004 |
| DE | 1465118 A2 | 10/2004 |
| DE | 60300065 T2 | 2/2006 |
| DE | 102006032060 A1 | 1/2008 |
| DE | 102007021765 A1 | 11/2008 |
| DE | 102007029861 A1 | 1/2009 |
| DE | 102008025033 A1 | 11/2009 |
| EP | 1038782 A1 | 9/2000 |
| EP | 1892107 A1 | 2/2008 |

OTHER PUBLICATIONS

International Search Report; International Application No. PCT/EP2011/051084; International Filing Date Jan. 26, 2011; Mail date Sep. 2, 2011.

* cited by examiner

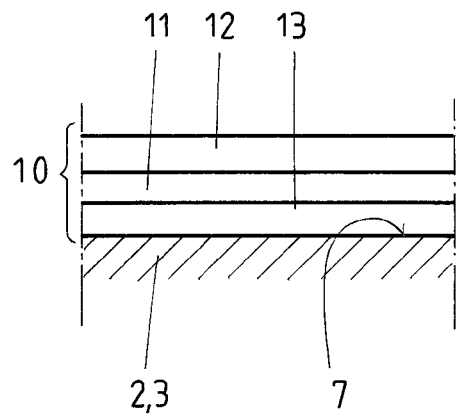
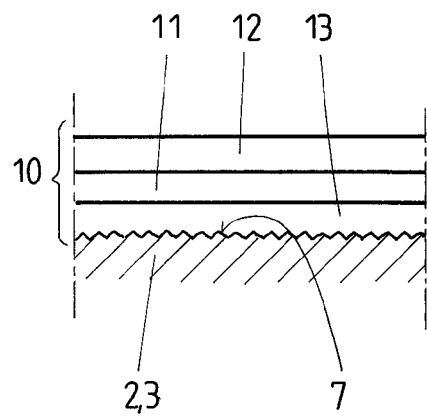
FIG.5  FIG.6
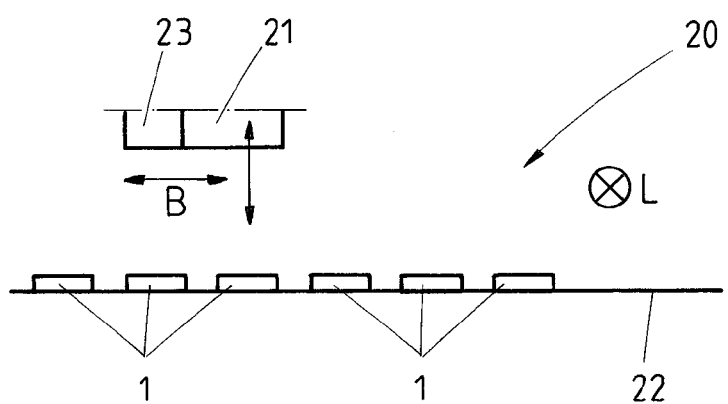
FIG.7

MOBILE IDENTIFICATION INDICATOR

TECHNICAL FIELD

The invention relates to a mobile identification transmitter for unlocking and locking a lock device of a motor vehicle, having an electronic unit which is arranged inside a housing. In addition, the invention relates to a method for the production of such a mobile identification transmitter.

BRIEF DESCRIPTION OF RELATED ART

A key for an automobile lock is disclosed in DE 44 29 999 C1. In this case, the key blank is attached to a grip which is glued together from two wooden plates. In addition, the grip has a recess into which a plate is inserted. This plate can have a printed emblem, for example. The entire grip, including the inserted plate, is sheathed by a protective paint coating.

A combined mechanical and electronic key for motor vehicles is disclosed in DE 10 2008 025 033 A1, having a key which is pivotably mounted in the housing of the combined key. In this case, the housing is composed of different shells, and a logo element is attached on one shell.

It has been shown to be disadvantageous that the arrangement of information elements on the housing of a motor vehicle key requires much time and effort for assembly. In addition, the design of such an information element often cannot be freely selected due to the particular geometry of the housing.

BRIEF SUMMARY

The problem addressed by the present invention is that of avoiding the disadvantages named above, and particularly providing a mobile identification transmitter and a method for the production of a mobile identification transmitter which is simple to manufacture, has esthetically appealing surface properties, and is resistant to external influences such as light, mechanical influences, and chemical degradation.

The problem is addressed by a mobile identification transmitter and by a method for the production of a mobile identification transmitter According to the invention, the housing has a defined outer surface, wherein a functional coating is applied thereto, and the functional coating has at least one layer, wherein a printed information layer is included for the purpose of individualizing the identification transmitter. An essential advantage of this invention is that a number of patterns, surface structures, etc., can be reproduced by means of the information layer, due to the different printing possibilities. For example, a "wood design" can be realized by means of the information layer.

It can likewise be contemplated that the functional coating has an adhesive layer and/or a color layer, wherein particularly the adhesive layer or the color layer is applied directly to the outer surface of the housing. In addition, and/or as an alternative thereto, it can be contemplated that the functional coating has a protective layer which is arranged on the information layer such that the information layer is arranged between the outer surface of the housing and the protective layer.

In a further embodiment of the invention, the functional layer can have a further protective layer which is arranged underneath the information layer, such that the information layer is positioned between both protective layers. Likewise, the color layer can be arranged between the adhesive layer and the protective layer arranged underneath the information layer, or the color layer can be arranged between the adhesive layer and the information layer, or the color layer can be arranged between the information layer and the outer surface of the housing. The adhesive layer serves to provide adhesion between the color layer or the information layer and the housing.

In general, the housing of the mobile identification transmitter is made of a plastic, particularly a black plastic. The housing receives a type of base color via the application of the color layer, which can be black, blue, red, etc., for example. This color layer can be applied directly to the housing, or can be applied to the adhesive layer which was previously applied to the housing as an adhesive agent. According to the invention, the possibility exists of directly applying the information layer to the color layer, for example. Likewise, it can be contemplated that a protective layer is first applied to the color layer, and then the information layer is applied to the protective layer. After the information layer has been applied to the housing, the additional protective layer can be applied to the information layer.

The functional coating can advantageously be a printed layer in which is integrated the material of the protective layer and/or of the information layer and/or of the color layer and/or of the adhesive layer. This means that only one layer forms the functional coating, and the material of the protective layer and/or of the information layer and/or of the color layer and/or of the adhesive layer can be applied onto the defined outer surface of the housing by means of a printing process.

In one possible embodiment, it can be contemplated that the complete outer surface has the adhesive layer and/or the color layer and/or the one protective layer. In the subsequent step, a defined surface can be printed with the information layer for the purpose of individualizing the identification transmitter.

The invention can relate to a mobile identification transmitter having at least one button element, by means of which a defined function can be triggered. Likewise, it can be contemplated that a mobile identification transmitter is used which is designed with no buttons.

The information layer which is protected by the protective layer, and particularly is sealed, has an informative contents, for example a logo, lettering, a color, a brand, a graphic, a name of the owner of the key, the automobile brand of the motor vehicle, or a defined signal color for the purpose of individualizing the identification transmitter. As such, it is possible to dispense with known key fobs which can carry such information, for example, because the information under discussion is applied directly onto the housing of the mobile identification transmitter.

In addition, according to the invention, the housing can have a defined outer surface onto which the functional coating is applied, wherein the functional coating has at least two layers, wherein the information layer is included for the purpose of individualizing the identification transmitter, on which a protective layer is arranged, and the information layer is arranged between the outer surface of the housing and the protective layer. The protective layer can be a clear paint or a paint layer, for example, which is particularly designed as at least partially transparent. The protective layer in this case is designed to have a composition such that it is resistant to mechanical influences and chemical degradation because of its properties, while at the same time a corresponding visual appearance of the mobile identification transmitter is created. Moreover, the application of the functional coating is easy as part of the assembly, and thereby the entire process of the production of an identification transmitter is substantially simplified.

The protective layer can advantageously have at least one of the following components: binding agents, pigments, solvents, fillers, and additives. In this case, the protective layer forms a coating layer which is applied very thinly onto the information layer and/or onto the color layer. The functional coating is advantageously very thin, i.e., less than 50 μm.

In one possible embodiment of the invention, the adhesive layer arranged on the outer surface of the housing can be included, wherein the information layer or the color layer can be arranged on the adhesive layer. As such, the functional coating can be designed with an adhesive layer which is applied between the outer surface of the housing and the information layer. The adhesive layer preferably serves the purpose of improving the affinity and/or the adhesion of the information layer, or the color layer, on the outer surface of the housing. In this case, it can be contemplated that the adhesive layer has suitable adhesive agents, preferably solvent-based, water-based, or UV-cured. In one possible embodiment, the adhesive layer can comprise the following:

approx. 20 to 30 percent by weight binding agent, preferably adhesive resin;

approx. 1 to 3 percent by weight filler, preferably inorganic filler, preferably pyrogenic silicic acid;

approx. 50 to 90 percent by weight solvent, preferably organic solvent.

The adhesive layer can also be solvent-free.

In a further embodiment of the mobile identification transmitter, the surface of the outer surface of the housing can be activated in such a manner that the wettability and/or the adhesive strength, particularly with respect to the adhesive layer and/or the information layer and/or the color layer is increased. In this way, a pre-treatment of the defined outer surface of the housing is carried out, wherein particularly oxidation processes can take place which polarize the outer surface of the housing. In this case, an oxidative treatment can be carried out with high energy on the defined outer surface of the housing. It has been found that particularly the outer surface, the same comprising plastic, of the housing has a non-polar surface which is difficult to bond and/or coat. Via a corresponding application of energy by means of the activation of the surface of the outer surface of the housing, a structural modification of the outer surface of the housing is also achieved, such that as a result an improved wettability and improved adhesive strength of the outer surface of the housing is created. By means of the corresponding activation of the outer surface, a physical treatment is carried out in such a manner that the surface energy of the surface of the housing is increased, such that a reliable attachment is created between the adhesive layer, the color layer, or the information layer and the activated outer surface of the housing. Likewise, it can be contemplated that the surface of the adhesive layer and/or of the information layer and/or of the color layer is additionally or alternatively activated.

The protective layer, the color layer, and the adhesive layer can be applied by means of spraying or injection spraying onto the housing. In this case, it can be contemplated that pressure atomizers are used which can apply the respective layer by means of a compressor at low pressure, particularly between 0.5 and 1 bar, at high pressure, particularly between 4 and 8 bar, or in an airless spraying process, particularly between 60 and 340 bar. Likewise, it can be contemplated that the protective layer and/or adhesive layer and/or color layer is applied to the housing by means of dip-coating. Electrocoating, particularly anodic dip painting and/or cathodic dip painting can be advantageous, particularly in the case of workpieces such as a mobile identification transmitter which can be different designs according to the model. As an alternative, an electrostatic spraying process can be used to apply the protective layer and/or the adhesive layer and/or the color layer. In this case, an electrostatic high-voltage field of approximately 70 to 160 kV can be used. One advantage of this electrostatic spraying process is that this process can be carried out in a fully automatic manner with robots.

The application of the protective layer and/or the adhesive layer and/or the color layer is advantageously realized by means of printing. In this case, it can be contemplated that all relevant layers of the functional coating are printed onto the outer surface of the housing, wherein in one special embodiment of the invention, only one print head is used to apply the functional coating to the housing. This means that in a device for the application of the functional coating, it is possible for all layers of the functional coating to be applied, and particularly printed, whereby the process for the application of the named functional coating to the mobile identification transmitter can be substantially simplified.

In one embodiment of the mobile identification transmitter, the information layer is printed, wherein the protective layer and/or the adhesive layer and/or the color layer is sprayed on. The information layer can be applied via print rolls or in a contactless manner, for example, particularly by means of injection printing. For example, a colorant, particularly ink, can be applied to the housing, wherein the information layer is then created. This ink can be designed to cure in light, particularly UV light, for example. In this embodiment, an illumination device can be used which applies the required energy for the purpose of curing the ink. In this way, it is possible to achieve a rapid hardening of the ink, whereby the ink is prevented from running on the printed item, particularly onto the housing of the mobile identification transmitter. In this case, it has been surprisingly shown that the radiated energy of the illumination device has two advantages: first, a reliable fixing of the printed ink on the surface of the housing of the identification transmitter is realized. And second, the radiated energy serves to cure and harden the printed ink such that it remains reliably bonded to the outer surface of the housing. In addition, a sharp and clear printed image is achieved on the functional coating, particularly on the information layer, by means of the corresponding emission of radiated energy.

In a further embodiment of the invention, the functional coating, particularly the information layer, can be irradiated with a certain radiated energy multiple times. It has been shown that a more rapid curing can be achieved in this way, wherein at the same time an increased resistance to scratching of the functional coating can be achieved.

The housing can advantageously be designed of at least one first and one second separate shell, wherein the outer surface of the first separate shell has the functional coating. In this case, the housing is composed of different separate shells which entirely enclose the electronic unit of the mobile identification transmitter when in the assembled state. The separate shells are, for example, laser welded during the assembly of the mobile identification transmitter. Alternative attachment options for the separate shells can of course be contemplated. At least one of the separate shells carries the functional coating which is clearly visible for the user of the identification transmitter. A single shell can also be designed as a removable battery compartment cover which can be designed with the functional coating named above. The battery which supplies the electronic unit located inside the housing with appropriate voltage is located inside the housing, particularly beneath the battery compartment cover.

In a further measure which improves the invention, the outer surface of the housing can comprise a plastic, and particularly the first separate shell can comprise a plastic. According to the present invention, the housing of the identification transmitter can comprise a thermoplastic, elastomeric, or heat curable polymer, as well as any mixture of such polymers. The term "polymer" also includes the homopolymers and copolymers. It has been shown that good results can be achieved in the application of the functional coating using thermoplastic polymers. Good results have particularly been obtained in the application of the functional coating with plasticized or non-plasticized polymers of vinyl chloride (VC), with polymers of vinylidene fluoride (VdF) and with polyolefins. In any case, multiple different plastics can be used in homogeneous or heterogeneous mixtures, for example to improve the impact resistance of the housing of the mobile identification transmitter.

One or more conventional mineral fillers can also optionally be added to this or these plastic(s), including calcium carbonate, titanium dioxide, fillers of plant-based origins such as saw dust, reinforcing fibers such as glass or carbon fiber for example, and one or more conventional additives such as stabilizers, lubricants, or antioxidants.

The plastic can particularly be selected according to the invention from the group consisting of polyamides, polyolefins, PP, PPS, polyurethanes, ABS (acrylonitrile butadiene styrene), PBT (polybutylene terephthalate), and PC (polycarbonates). Polyamides, preferably, are suitable for improving the wettability and/or the adhesive strength.

In one advantageous embodiment, the protective layer which covers the information layer and/or the color layer is designed as at least partially transparent. In this way, it is possible to achieve a reliable seal and protection of the information layer and the color layer. The protective layer can also have additional material properties, particularly high resistance to scratching.

The mobile identification transmitter can work together with an electronic locking system for motor vehicles, via the button element. In this case, the mobile identification transmitter can be equipped with "keyless go" or "keyless entry" functionalities. In contrast to the conventional remote control with the identification transmitter, no active operation of the button element of the identification transmitter is required as part of the keyless entry functionality to open/unlock/lock a vehicle door or the vehicle trunk. Rather, a communication is initiated between the motor vehicle and the identification transmitter upon the actuation of the door grip on the automobile door; and upon a positive authentication, the electrical door opening of the motor vehicle is activated. This means that the user carrying a valid identification transmitter can open his motor vehicle without having actively actuated the touchless identification transmitter. For example, it can be contemplated in one possible embodiment that an access control method is included, wherein upon actuation of the door grip, a transmission pulse is sent via an inductive antenna to the identification transmitter, the identification transmitter is then awoken and transmits a radio signal to the transceiver unit on board the vehicle, which in turn relays this signal from a control device for the access authentication. If the correct code is detected at this point, then the electric door opening or trunk opening is activated by means of the corresponding control issued by the control devices. The same can play out upon a closing of the door by contact with the door grip.

For the keyless go functionality, a control device on board the vehicle is awakened via a start switch in the gear shifter or in the cockpit, and then transmits a pulse to the identification transmitter located inside the vehicle. The identification transmitter transmits a radio signal back. Upon detection of the correct code, the engine of the motor vehicle then starts via the central control device.

The present invention is likewise addressed by a method having the features of claim 14. According to the invention, the housing, the same being an injection molded plastic part, is first provided. Next, a functional coating is applied onto a defined outer surface of the housing, wherein an information layer is printed thereon for the purpose of individualizing the identification transmitter. The identification transmitter is able to have a custom design by means of the printed information layer. In addition to lettering, the functional coating can suggest a metallic appearance, for example, to the observer, said appearance being realized by means of corresponding printing technology.

In a further embodiment of the invention, a protective layer can be applied over the information layer for the purpose of sealing and protecting the information layer. The application of the information layer is carried out in a first step, and the protective layer is carried out in a second step.

In a further option for the invention, it can be contemplated that an adhesive layer or a color layer is first applied directly to the outer surface of the housing prior to an application of the information layer, wherein the adhesive layer provides an increased binding effect for the information layer on the housing. In addition, the adhesive layer can have suitable adhesive agents which ensure an improved adhesion of the functional coating, particularly of the information layer or the color layer on the housing. The method according to the invention is advantageously characterized in that the functional coating can be applied to the housing in a simple and rapid manner. In this case, diverse geometries of the housing can be contemplated, and the information layer can be printed on the same. The individual layers of the functional coating in this case can be applied sequentially to the housing. The functional coating preferably has a thickness of less than 50 µm, and preferably less than 30 µm.

It can also be contemplated that the adhesive layer is first applied onto the outer surface of the housing prior to the printing process for the information layer, and then the color layer is applied to the adhesive layer. Likewise, a protective layer can first be applied onto the adhesive layer or onto the color layer, wherein the information layer is applied onto said protective layer for the purpose of individualizing the identification transmitter. A further application of a protective layer is then carried out on top of the information layer.

In a further preferred embodiment of the invention, the outer surface of the housing, the same being intended to have the information layer, can first be cleaned prior to an application of the functional coating, and particularly the outer surface of the housing can be degreased. It has been shown that a cleaned, degreased outer surface of the housing offers a particularly good adhesive effect for the functional coating, particularly for the adhesive layer and/or the information layer and/or the color layer.

Likewise, it can be contemplated according to one embodiment of the invention that the surface of the outer surface of the housing is activated prior to an application of the functional coating, whereby the wettability and/or the adhesive strength, particularly with respect to the adhesive layer and/or the information layer and/or the color layer is increased. In this case, the activation can include at least one of the following processes: a flame treatment, a corona discharge, plasma treatment, laser treatment, fluorination, or silication. The term activation can mean any oxidizing treatment with high energy, such as a treatment with ozone or also an oxidation step with oxygen and heating to a temperature which is lower than the melting point of the material of the housing of the identification transmitter. These processes and/or treatments for the purpose of activating the surface of the housing enable chemical binding, for example of oxygen, to the plastic of the housing.

When the oxidation with oxygen is undertaken, the region is preferably brought to a temperature which is 10 to 140° C. lower than the melting point of the plastic material. This heating can be carried out by means of any known means, for example by means of infrared radiation or by blowing hot air. The named processes for the purpose of activating the surface of the housing can of course be combined with each other.

In a further embodiment of the invention, the housing is designed of at least two separate shells, wherein the functional coating is applied to at least one separate shell, and then the individual components of the identification transmitter, particularly the separate shells and/or the button element and the electronic unit are assembled. This means that initially the corresponding functional coating is applied to the separate shell before the entire mobile identification transmitter, with its respective individual components including the electronic unit, etc., is assembled. One of the advantages in this case is that only the shell of the identification transmitter which is intended to be printed is fed to the printing device. As such, it is not necessary to undertake a complicated masking of the areas of the housing of the identification transmitter which are not meant to be printed in order to effectively prevent a non-printing at certain places on the housing.

The adhesive layer and/or the protective layer and/or the color layer can be applied in diverse ways to the housing of the identification transmitter; the adhesive layer and/or the protective layer and/or the color layer are particularly sprayed or printed. The information layer which is covered by the protective layer is printed on the housing or on the adhesive layer or on the color layer.

In a further preferred embodiment of the invention, a print head can be provided for the purpose of applying the functional coating, and a platform with a plurality of receptacles can be provided, wherein one housing is arranged in each receptacle, and during the application of the functional coating the print head and/or the platform is moved via a drive, and particularly the distance between the print head and the platform is changed. In this case, it can be contemplated that the print head moves during the application of the functional coating and applies the respective layers of the functional coating to the housing. The housing can be arranged stationary with respect to a moving print head. Likewise, it can be contemplated that the housing can also move along an axis. In addition, it can be contemplated that the distance between the print head and the platform, and particularly the housing, can be changed during the application of the functional coating.

A further aspect of the invention relates to a device for the application of a functional coating on a mobile identification transmitter, having the features of claim 25. According to the invention, a print head is provided for the purpose of applying the functional coating to an outer surface of the housing, and the print head is movably mounted relative to the housing, wherein the functional coating has a printed information layer for the purpose of individualizing the identification transmitter.

In this case, a print head can further be provided for the purpose of applying the functional coating to an outer surface of the housing, and the print head is movably mounted relative to the housing, wherein the functional coating has at least two layers, wherein an information layer is included for the purpose of individualizing the identification transmitter, and a protective layer is arranged on said information layer, wherein the information layer is arranged between the outer surface of the housing and the protective layer.

In a further preferred embodiment of the device, a platform can be included which has a plurality of receptacles, wherein one housing can be inserted into each receptacle.

In addition, it can be contemplated that the functional coating is exposed to a defined radiated energy which is particularly emitted by an illumination device. In this case, the radiated energy serves the purpose of reliably curing the information layer which preferably comprises a light-curable ink. As such, it is possible to achieve a sharp printed image. In addition, the illumination device can be arranged on the print head, thereby achieving a compact overall device for the application of a functional coating to the mobile identification transmitter. The illumination device is preferably integrated into the print head.

BRIEF DESCRIPTION OF THE DRAWINGS

Additional advantages, features, and details of the invention are found in the following description, in which multiple embodiments of the invention are described with reference to the illustrations. The features indicated in the claims and in the description can each be essential for the invention either alone or in any combination thereof.

FIG. 5 shows a further alternative of the cutaway view according to FIG. 1, FIG. 6 shows a further alternative of the cutaway view according to FIG. 1

FIG. 7 shows a purely schematic view of a device according to the invention for the application of a functional coating to a mobile identification transmitter.

DETAILED DESCRIPTION

Figure 1:
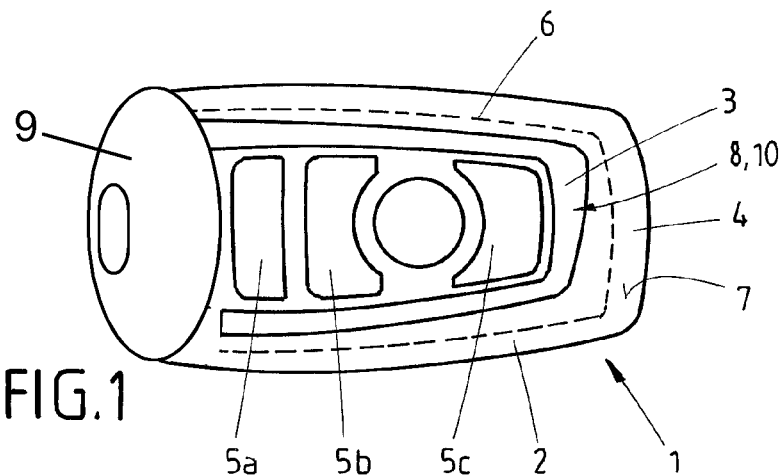
FIG. 1 shows a top view of a mobile identification transmitter.

FIG. 1 shows a mobile identification transmitter 1, by means of which it is possible to initiate an unlocking and locking process of a locking device, which is not explicitly illustrated, of a motor vehicle. This initiation is carried out in the present embodiment by a keyless activation of a button element 5a, 5b, 5c arranged in the housing 2 of the identification transmitter 1. As an alternative, all figures can refer to an identification transmitter 1 which functions in a touchless manner. The term activation can simultaneously also mean an upstream access control procedure. This means that the mobile identification transmitter 1 has stored identification data which is included in the schematically illustrated electronic unit 6. This electronic unit 6 is located inside the housing 2 and is therefore protected from any environmental influences. The identification data can be transmitted by radio signal via a transceiver unit of the identification transmitter 1 to a further transceiver unit of the motor vehicle, which is not illustrated, for the purpose of activating the lock device of the motor vehicle. Due to a bi-directional communication between the identification transmitter 1 and the motor vehicle, an opening process and/or a closing process of the lock device of the motor vehicle is activated. This depends on the extent to which a positive identification has occurred.

In order to achieve an individualization of the identification transmitter 1, a functional coating 10 is applied to a defined outer surface 7 of the housing 2. The functional coating 10 has a signal color according to FIG. 1 which at least partially includes the button elements 5*a*, 5*b*, 5*c*. In the present embodiment, the housing 2 is composed of different separate shells 3, 4, 9. The outer surface 7 of the separate shell 3, which has a u-shaped profile, is entirely coated with the functional coating 10.

Figure 2:
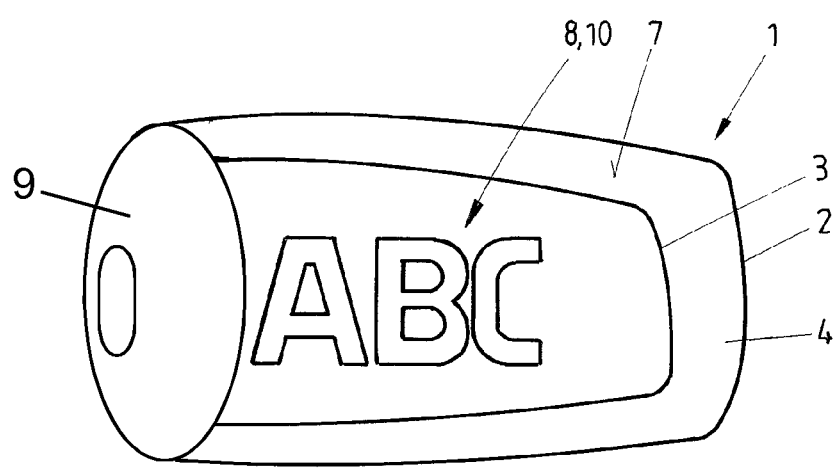
FIG. 2 shows an additional view of a mobile identification transmitter.

FIG. 2 shows a further embodiment alternative of the identification transmitter 1, wherein the functional coating 10 has lettering 8. In this embodiment as well, the first separate shell 3 has the functional coating 10, while the other separate shells 4, 9 are free of any functional coating. Of course, in a further embodiment variant which is not explicitly shown, it can be contemplated that multiple separate shells of the housing 2 are designed with functional coatings 10.

Figure 3:
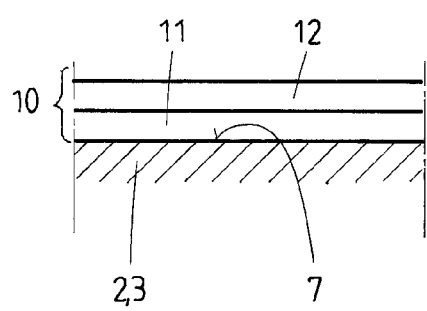
FIG. 3 shows a cutaway view along the identification transmitter as in FIG. 1, through the functional coating thereof.

One possible alternative of the functional coating 10 in question is illustrated in FIG. 3. The functional coating 10 is applied to the outer surface 7 of the housing 2. In this case, the functional coating 10 has an information layer 11 which is directly printed onto the outer surface 7 of the housing 2. A protective layer 12 is applied over the information layer 11. The functional coating 10 in this case is on the separate shell 3 of the housing 2.

Figure 4:
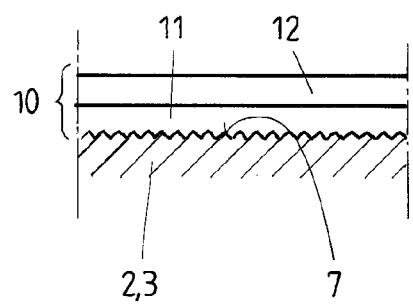
FIG. 4 shows a further alternative of the cutaway view according to FIG. 1.

The functional coating 10 shown in FIG. 4 substantially corresponds to the functional coating 10 in FIG. 3. The difference compared to FIG. 3 is only that the outer surface of the housing 2 in FIG. 4 is activated in order to increase the wettability and/or the adhesive strength with respect to the information layer 11. The activation of the housing 2 is carried out by means of a treatment of the outer surface 7 with high energy. At least one of the following treatment processes may be suitable for this: flame treatment, corona discharge, plasma treatment, laser treatment, ozone treatment, fluorination, or silication.

A functional coating 10 is illustrated in FIG. 5 which comprises three layers 11, 12, 13. In the present embodiment, an adhesive layer 13 is applied to the outer surface 7 of the housing 2, and the information layer 11 is arranged on the adhesive layer 13. In this case, the information layer 11 is located between the protective layer 12 on the outside and the adhesive layer 13. The adhesive layer 13 provides a stronger adhesive bond between the information layer 11 and the outer surface 7.

The functional coating 10 in FIG. 6 substantially corresponds to the functional coating 10 in FIG. 5, wherein the outer surface 7 of the housing 2 is activated to increase the adhesive strength. In order to avoid repetitions, reference is hereby made to FIG. 4. The adhesive layer 13 is situated on the activated outer surface 7 of the housing 2. The information layer 11 is printed onto the adhesive layer 13, and the protective layer 12 is applied on the information layer 11.

Figure 8:
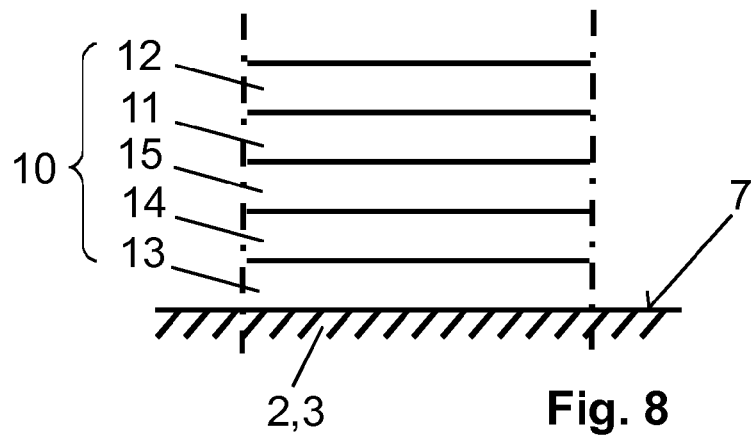
FIG. 8 shows a further alternative of the cutaway view according to FIG. 1.

In FIG. 8, a functional coating 10 is applied on the outer surface 7 of a housing 2. This functional coating 10 has 5 layers 11, 12, 13, 14, 15. An adhesive layer 13 is initially applied on the outer layer 7 of the housing 2. A color layer 14 is located over that. A protective layer 15 is applied over the color layer 14. The information layer 11 is printed over the protective layer 15, and then a further protective layer 12 is applied over the information layer 11. The color layer 14 can cover the entire housing 2 or the respective separate shell 3, 4 of the housing 2, for example. The color layer 14 can constitute the base color for the housing 2, for example. The individualization by means of the information layer 11 is realized above the color layer 14, wherein said information layer 11 is positioned between the two protective layers 12, 15 like a sandwich.

Figure 9:
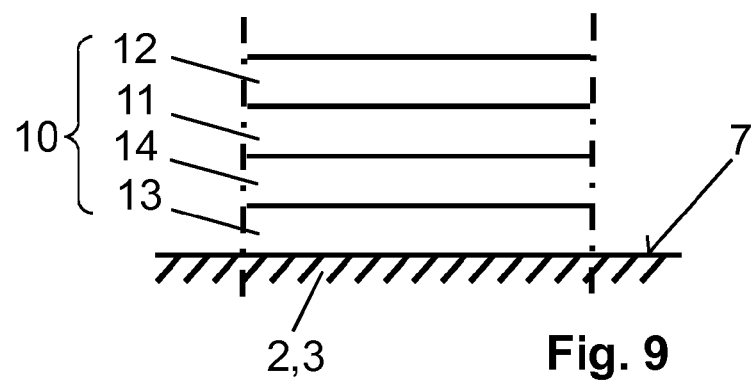
FIG. 9 shows a further alternative of the cutaway view according to FIG. 1.
Figure 10:
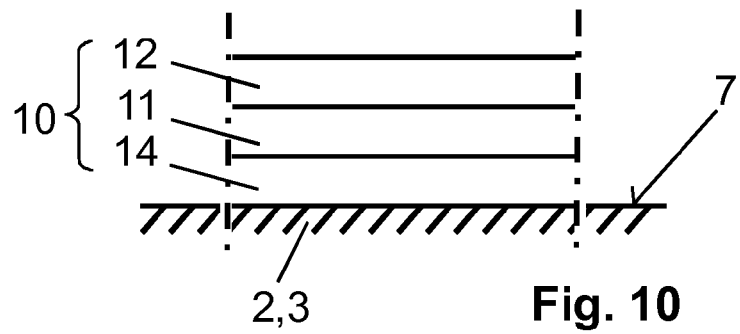
FIG. 10 shows a further alternative of the cutaway view according to FIG. 1.

In FIG. 9 and FIG. 10, the color layer 14 can likewise serve as the base coloring for the housing 2. In FIG. 9, the information layer 11 is situated directly on top of the color layer 14, wherein an adhesive layer 13 is also used here to increase the adhesive strength, and is positioned between the color layer 14 and the outer surface 7 of the housing 2. As in FIG. 3 to FIG. 6 and/or FIG. 8, the protective layer 12 is located above the information layer 11.

In FIG. 10, a functional coating 10 is used, and is applied without an adhesive layer in contrast to the embodiment shown in FIG. 9. This means that the functional coating 10 comprises three layers 11, 12, 14, and the color layer 14 is directly applied to the outer surface 7 of the housing 2. The information layer 11 is printed onto the color layer 14 which is in turn protected by the protective layer 12.

Figure 11:
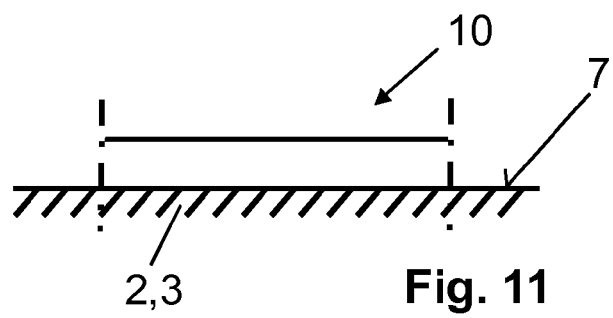
FIG. 11 shows a further alternative of the cutaway view according to FIG. 1.

A further embodiment is shown in FIG. 11, having a functional coating 10 which only has one layer. This layer is printed onto the housing 2. The unique characteristic in this case is that this printed layer can comprise the material of the protective layer and/or the information layer and/or the color layer and/or the adhesive layer. In this way, the time for coating of the functional coating can be substantially reduced, and it is simultaneously possible to reduce the layer thickness compared to the other embodiments.

The functional coatings 10 described in FIG. 1 to FIG. 6 and FIG. 8 to FIG. 11 are at least partially printed-on. This means that the information layer 11 is printed via a print head 21, for example, as schematically illustrated in FIG. 7. The layers 12 and/or 13 can be sprayed on or printed on. In this case, it is reasonable to provide a device 20 for the application of the functional coating 10 which can simultaneously apply all layers 11, 12, 13, 14, 15 of the functional coating 10 onto the housing 2 of the mobile identification transmitter 1. According to FIG. 7, the print head 21 can move in a width direction B. In addition, the device 20 has a platform 22 which includes a plurality of receptacles, and one identification transmitter 1 is arranged in each receptacle. According to the embodiment in FIG. 7, the platform 22 can also move in the plane of the drawing, particularly along a longitudinal direction L. Moreover, the print head 21 can move in the direction of the platform 22, such that the distance between the housing 2 of the identification transmitter 1 and the print head 21 can be varied. This distance change can be advantageous in cases when the identification transmitter 1 has a complicated geometry. In this case, the print head 21 can be tracked along the surface 7 of the housing 2 by a corresponding distance change in order to effect a consistent distance between the print head 21 and the outer surface 7 of the housing 2 during the entire application of the functional coating 10, for example. Such an option for the movement of the print head 21 is advantageous with regard to print quality. Of course, as an alternative it can be contemplated that a distance change with respect to the print head 21 can be realized via a movement of the platform 22.

In the case of identification transmitters 1 with simple geometries, it can be sufficient that the print head 21 is merely able to be guided along a first direction B, and the platform 22 is able to be guided along the direction L. As an alternative, it can be contemplated that the print head 21 is fixed during the application of the functional coating 10, and only the platform 22 is moved in the corresponding directions L, B. As an alternative, the platform 22 can be fixed, and the print head 21 can be moved along the direction B and L.

According to FIG. 7, it can be contemplated that an illumination device 23 is provided which emits radiant energy onto the functional coating 10, particularly onto the information layer 11 or onto the remaining layers 12, 13, 14, 15. In this way, it is possible to realize a more rapid curing of the materials of the functional coating 10, particularly the materials of the information layer 11. As a result, it is possible to improve the printed image of the functional coating 10. A light-curable ink is preferably used for the information layer 11, which is applied to the housing 2 by means of the print head 21.

In order to further increase the wettability and/or the adhesive strength of the functional coating 10, it can be reasonable as according to FIG. 1 to FIG. 6 as well as FIG. 8 to FIG. 11 to clean the outer surface 7 of the housing 2 prior to the application of the functional coating 10, particularly to degrease the outer surface 7 or to activate the same as according to FIG. 4.

The invention claimed is:

1. A mobile identification transmitter for unlocking and locking a locking device of a motor vehicle, having
    an electronic unit which is arranged inside a housing, wherein
    the housing has a defined outer surface onto which a functional coating is applied, wherein the functional coating has at least one layer, wherein a printed information layer is included for the purpose of individualizing the identification transmitter, wherein the functional coating is a printed layer in which at least the material of at least one of a protective layer, an information layer, a color layer, and an adhesive layer is integrated, wherein only one layer forms the functional coating, so that the material of the protective layer and/or of the information layer and/or of the color layer and/or of the adhesive layer can be applied onto the defined outer surface of the housing by means of a printing process.

2. A mobile identification transmitter according to claim 1, wherein
    the functional coating has an adhesive layer and/or a color layer, wherein the adhesive layer or the color layer is particularly directly applied to the outer surface of the housing.

3. A mobile identification transmitter according to claim 1, wherein
    the functional coating has a protective layer which is arranged on the information layer, such that the information layer is arranged between the outer surface of the housing and the protective layer.

4. A mobile identification transmitter according to claim 3, wherein
    the functional layer has a further protective layer which is arranged beneath the information layer such that the information layer is positioned between both protective layers.

5. A mobile identification device according to claim 1, wherein
    the color layer is arranged between the adhesive layer and the protective layer which is arranged beneath the information layer, or in that the color layer is arranged between the adhesive layer and the information layer, or in that the color layer is arranged between the information layer and the outer surface of the housing.

6. A mobile identification device according to claim 1, wherein
    the housing has at least one button element for the purpose of initiating a defined function.

7. A mobile identification device according to claim 1, wherein
    the surface of the outer surface of the housing is activated in such a manner that the wettability and/or the adhesive strength, particularly with respect to the adhesive layer and/or the information layer and/or the color layer is increased.

8. A mobile identification device according to claim 1, wherein
    the functional coating is at least partially printed-on, particularly in that the information layer is printed-on.

9. A mobile identification device according to claim 1, wherein
    the housing is constructed of at least one first and one second separate shell, wherein the outer surface of the first separate shell has the functional coating.

10. A mobile identification device according to claim 1, wherein
    the outer surface of the housing includes a plastic, wherein a first separate shell includes a plastic.

11. A mobile identification device according to claim 1, wherein
    the information layer has a lettering, a color, a graphic, a metallic color, or a logo element.

12. A mobile identification device according to claim 1, wherein
    the protective layer is designed as at least partially transparent.

* * * * *